United States Patent
Chae

(10) Patent No.: US 9,417,953 B2
(45) Date of Patent: Aug. 16, 2016

(54) APPARATUS AND METHOD FOR DECODING DATA

(71) Applicant: SK hynix Inc., Gyeonggi-do (KR)

(72) Inventor: Chol Su Chae, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 146 days.

(21) Appl. No.: 14/254,659

(22) Filed: Apr. 16, 2014

(65) Prior Publication Data

US 2015/0170765 A1 Jun. 18, 2015

(30) Foreign Application Priority Data

Dec. 13, 2013 (KR) .................. 10-2013-0155545

(51) Int. Cl.
*G06F 11/10* (2006.01)
*G11C 29/54* (2006.01)
*G11C 29/04* (2006.01)

(52) U.S. Cl.
CPC ........ *G06F 11/1008* (2013.01); *G06F 11/1048* (2013.01); *G11C 2029/0411* (2013.01)

(58) Field of Classification Search
CPC ............ G06F 11/1008; G06F 11/1048; G11C 2029/0411
See application file for complete search history.

(56) References Cited

U.S. PATENT DOCUMENTS

| 8,335,977 | B2 | 12/2012 | Weingarten et al. | |
| 8,365,030 | B1* | 1/2013 | Choi .................... | G06F 11/1048 714/746 |
| 2008/0034270 | A1* | 2/2008 | Onishi ................ | G06F 11/1048 714/758 |
| 2009/0073009 | A1* | 3/2009 | Oda ................... | H03M 13/2915 341/94 |
| 2009/0259921 | A1* | 10/2009 | Chang ................ | H03M 13/153 714/782 |
| 2010/0199149 | A1* | 8/2010 | Weingarten ......... | G06F 11/1068 714/773 |
| 2011/0016371 | A1* | 1/2011 | Sakimura ............ | G06F 11/1008 714/763 |

FOREIGN PATENT DOCUMENTS

JP          2005-526965          9/2005

* cited by examiner

*Primary Examiner* — Cynthia Britt
*Assistant Examiner* — Dipakkumar Gandhi
(74) *Attorney, Agent, or Firm* — IP & T Group LLP

(57) ABSTRACT

A data decoding apparatus includes a first decision unit suitable for determining whether or not an error is present in a read data based on a first decoding method and identifying an error occurrence position, wherein the read data is read by a first read voltage, a second decision unit suitable for determining a low reliability position that belongs to the error occurrence position by checking reliability of the error occurrence position based on a second read voltage changed from the first read voltage within a set range, and an error correction unit suitable for generating an error correction data by correcting an error of the low reliability position.

18 Claims, 8 Drawing Sheets

APPARATUS AND METHOD FOR DECODING DATA

CROSS-REFERENCES TO RELATED APPLICATION

The present application claims priority under 35 U.S.C. §119(a) to Korean application number 10-2013-0155545, filed on Dec. 13, 2013, in the Korean Intellectual Property Office, which is incorporated herein by reference in its entirety.

BACKGROUND

1. Technical Field

Various embodiments of the present invention relate to an apparatus and method for decoding data, and more particularly, to an apparatus and method for decoding data using a hard decision decoding method and a soft decision decoding method.

2. Related Art

An electronic device may perform various types of operations, and to send and receive data is one of the various types of operations performed by the electronic device.

The transmission and reception of data may be accompanied by encoding and decoding operations. Encoding means converting data in accordance with a specific rule, and decoding means restoring encoded data to the original data based on an encoding rule.

If data stored in a memory cell is to be decoded, an error detection/correction method for determining whether the stored data has been accurately read or not may be used.

SUMMARY

Described herein are a data decoding apparatus and method for reducing a bit error rate (BER) by using both hard and soft decision decoding methods in identifying a plurality of cells including an error in a data decoding process and performing a correction process on an identified error.

In an embodiment of the present disclosure, a data decoding apparatus according to the present disclosure includes a first decision unit suitable for determining whether or not an error is present in a read data based on a first decoding method and identifying an error occurrence position, wherein the read data is read by a first read voltage, a second decision unit suitable for determining a low reliability position that belongs to the error occurrence position by checking reliability of the error occurrence position based on a second read voltage changed from the first read voltage within a set range, and an error correction unit suitable for generating an error correction data by correcting an error the low reliability position.

In another embodiment of the present disclosure, a data decoding method includes determining whether or not an error is present in a data and identifying an error occurrence position based on a first decoding method, wherein the data is read by a first read voltage, determining a low reliability position that belongs to the error occurrence position by reading data at the error occurrence position using a second read voltage changed from the first read voltage, and generating an error correction data by correcting an error of the low reliability position.

In further embodiment of the present disclosure, a data decoding apparatus includes a plurality of memory cells arranged in rows and columns a first decision unit suitable for checking first read data of the memory cells in each of the rows and columns and determining error memory cells having an error, a second decision unit suitable for re checking second read data of the error memory cells and determining a low reliability memory cell of the error memory cells, wherein the second read data is read by a different voltage from the first read data, and an error correction unit suitable for generating an error correction data by correcting a data of the low reliability memory cell.

DETAILED DESCRIPTION

Figure 1:
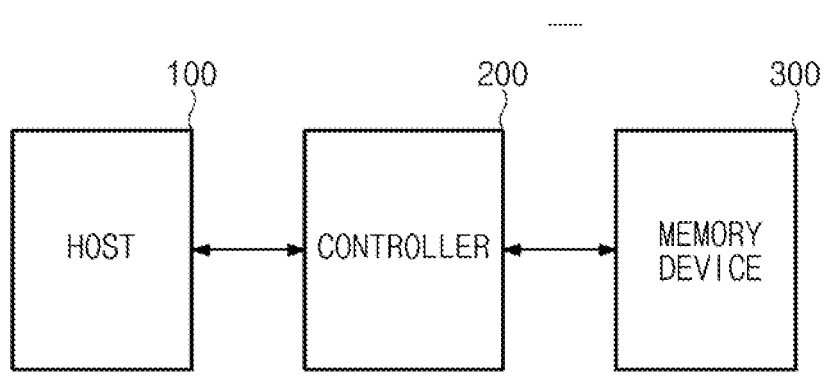
FIG. 1 is a block diagram of a data decoding apparatus according to an embodiment of the present disclosure.

Hereinafter, an apparatus and method for decoding data according to the present disclosure will be described below with reference to the accompanying drawings through exemplary embodiments.

Some embodiments of the present disclosure are described in more detail with reference to the accompanying drawings. The same reference numerals are used to denote the same elements throughout the drawings, and a redundant description of the same elements is omitted.

Specific structural and functional descriptions of embodiments of the present disclosure disclosed in this specification have been merely illustrated to describe the embodiments of the present disclosure. The embodiments of the present disclosure may be implemented in various forms and should not be construed as being limited to embodiments described in this specification or application.

FIG. 1 is a block diagram of a data decoding apparatus 10 according to an embodiment of the present disclosure.

Referring to FIG. 1, the data decoding apparatus 10 may include a host 100, a controller 200, and a memory device 300.

The host 100 transfers a command to the controller 200 so that the controller 200 writes data into the memory device 300 or reads data from the memory device 300 and transfers the read data to the host 100. In other words, the controller 200 accesses the memory device 300 based on a command transferred from the host 100 and performs an operation corresponding to the command.

The host 100 may be coupled to the controller 200 through a host interface (not shown). The host 100 and the controller 200 transmit and receive control commands, addresses, and data signals through the host interface. In some embodiments, the host interface may include a serial advanced technology attachment (ATA), a parallel ATA, a small computer system interface (SCSI), and a peripheral component interconnect-express (PCI-Express), but the present disclosure is not limited thereto.

The controller 200 provides data to be written into the memory device 300 so that the data is stored in the memory device 300. Furthermore, the controller 200 may receive data read from the memory device 300 and provide the read data to the host 100. As described above, the controller 200 may provide data to be written into the memory device 300 or read specific data from the memory device 300 in response to a command from the host 100.

When data written in the memory device 300 is read again, it is ideal that the read data is identical to the written data, but the read data may not be identical to the written data. Accordingly, it is necessary to determine whether data to be written has been accurately written and whether read data is identical to written data or not and to correct an error.

The data decoding apparatus according to an embodiment of the present disclosure uses both hard and soft decision decoding methods in checking an error of information read from the memory device 300. In such a case, a bit error rate (BER) curve may be improved because an error of bits determined to have an error through a hard decision decoding method is improved through a soft decision decoding method.

Figure 2:
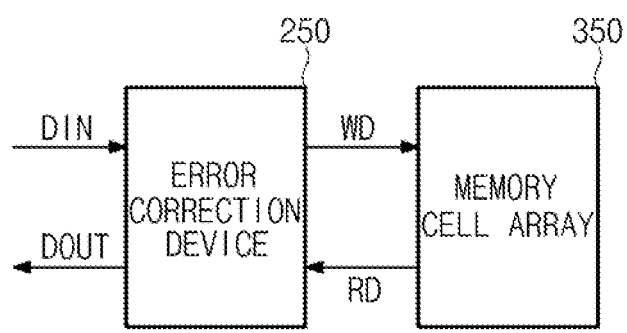
FIG. 2 is a block diagram showing a relation between an error correction device and a memory cell array included in the data decoding apparatus according to an embodiment of the present disclosure.

FIG. 2 is a block diagram showing a relation between an error correction device 250 and a memory cell array 350 included in the data decoding apparatus according to an embodiment of the present disclosure.

Referring to FIG. 2, the data decoding apparatus 10 may include the error correction device 250 and the memory cell array 350. The error correction device 250 may be included in the controller 200 or the memory device 300 of FIG. 1 or may be independently implemented.

The error correction device 250 may receive write information DIN and convert the write information DIN into write data WD that is to be actually written into the memory cell array 350. For example, the write data WD may include write bits that are to be actually written into the memory cell array 350 and error correction code (e.g., parity bits) generated based on the write bits.

The error correction device 250 may receive read data RD from the memory cell array 350 and convert the read data RD into read information DOUT. Like the write data WD, the read data RD may include write bits read from a memory cell and error correction code.

The error correction device 250 may determine whether an error is present or not by comparing the error correction code, actually included in the read data RD, with error correction code generated from the write bits read from the read data RD, correct the error, and provide the read information DOUT to the controller 200 or the host 100. In another embodiment, the error correction device 250 may determine whether an error is present or not by comparing the error correction code included in the write data WD with the error correction code included in the read data RD and correct the error. Alternatively, the error correction device 250 may detect an error based on only the read data RD.

The memory cell array 350 includes a plurality of rows, a plurality of columns, and a plurality of memory cells coupled to the intersections of the rows and the columns. The memory cells may include volatile memory cells, non-volatile memory cells, or both. In some embodiments, each of the memory cells may store one or more data bits. For example, in the case of a NAND flash memory cell included in a non-volatile memory cell, one data bit is stored in one memory cell in a single level cell (SLC) method, or two or more data bits are stored in one memory cell in a multi-level cell (MLC) method.

In this specification, the memory cell array 350 may include various elements for writing and reading data into and from memory cells in addition to the memory cells. For example, the memory cell array 350 may include a voltage generator, a row decoder, a column decoder, a write and read circuit and so on.

Figure 3:
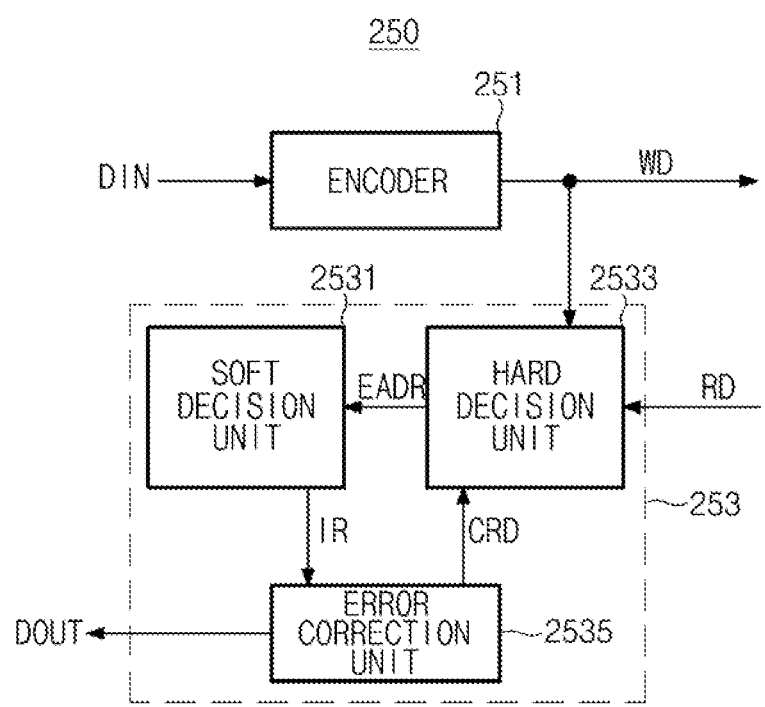
FIG. 3 is a block diagram of the error correction device according to an embodiment of the present disclosure.

FIG. 3 is a block diagram of the error correction device 250 according to an embodiment of the present disclosure.

Referring to FIG. 3, the error correction device 250 may include an encoder 251 and a decoder 253. The encoder 251 receives the write information DIN and generates the write data WD that is to be written into a memory cell in accordance with a predetermined encoding method. The write data WD includes error correction code in addition to information that is to be actually written.

The encoder 251 may generate the write data WD using write bits that are to be actually written and error correction code generated based on the write bits in accordance with an encoding method. For example, the encoder 251 may generate the write data WD using turbo product code (TPC).

The decoder 253 may include a hard decision unit 2533, a soft decision unit 2531, and an error correction unit 2535. The decoder 253 determines whether or not an error is present in the read data RD, corrects the error, and provides the read information DOUT.

The hard decision unit 2533 determines whether or not an error is present in the read data RD read from the memory cell array 350 in accordance with a predetermined decoding method. For example, the predetermined decoding method may include a TPC method like the encoding method.

The hard decision unit 2533 determines whether or not an error is present in each row and each column of the memory cell array 350 in accordance with a TPC method and identifies a row symbol and a column symbol in which an error has occurred. The identified error position is provided to the soft decision unit 2531 as an error occurrence position EADR.

The hard decision unit 2533 according to an embodiment of the present disclosure determines whether or not an error is present in each row and each column independently, thereby being capable of improving an error detection rate.

The soft decision unit 2531 reads data from memory cells, indicated by an error occurrence position EADR, again using a different read voltage. That is, the soft decision unit 2531 changes a read voltage Vread, applied to the memory cell array 350 when the decoder 253 previously received the read data RD from the memory cell array 350, and reads data using the changed voltage.

The reason why a read voltage is changed and data is read using the changed voltage is for checking a memory cell whose data value is changed on the basis of the read voltage. The change of a read voltage is described in detail later with reference to FIG. 6.

If there is a change of data as a result of reading data again using a changed read voltage, the soft decision unit 2531 determines a corresponding memory cell to be a low reliability cell and determines the position of the memory cell to be a low reliability position.

The soft decision unit 2531 may identify a low reliability position LR in the error occurrence position EADR by making a soft decision decoding on the error occurrence position EADR that has been determined to have an error by the hard decision unit 2533.

The error correction unit 2535 corrects an error of the read data RD at the low reliability position IR and provides error correction data CRD to the hard decision unit 2533 again.

The hard decision unit 2533 may determine whether or not an error is present in the error correction data CRD again so that the error correction unit 2535 corrects an error again depending on whether an error has occurred or not. The hard decision unit 2533 may also provide an error occurrence position EADR to the soft decision unit 2531 so that the soft decision unit 2531 determines whether or not an error is present in accordance with a soft decision method if it is determined that an error is present in error correction data CRD in accordance with a hard decision method.

After such error correction is performed by a predetermined number of times, the read information DOUT whose error has been corrected is provided to the controller 200 or the host 100.

The data decoding apparatus 10 according to an embodiment of the present disclosure may improve decoding performance because the hard decision unit 2533 primarily determines a memory cell having an error in accordance with a hard decision method, and the soft decision unit 2531 finally determines whether the memory cell has low reliability or not in accordance with a soft decision method.

Figure 4:
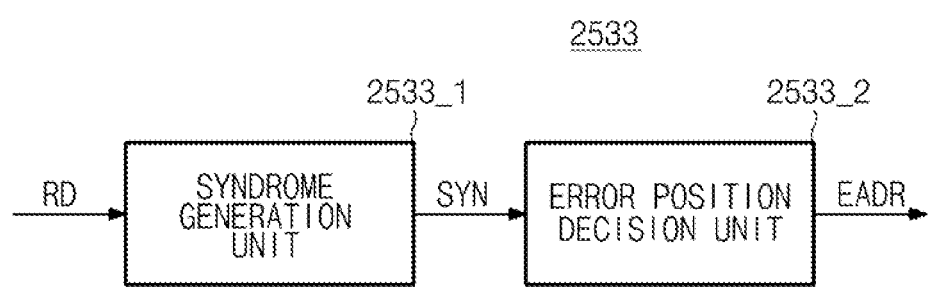
FIG. 4 is a block diagram of a hard decision unit according to an embodiment of the present disclosure.

FIG. 4 is a block diagram of the hard decision unit 2533 according to an embodiment of the present disclosure.

Referring to FIG. 4, the hard decision unit 2533 may include a syndrome generation unit 2533_1 and an error position decision unit 2533_2.

The syndrome generation unit 2533_1 may obtain a syndrome SYN by dividing the received read data RD by a primitive polynomial. Since the write data WD transmitted through the encoder 251 is made up of only the product of primitive polynomials, the remainder obtained by dividing the read data RD by a primitive polynomial is generated as a syndrome SYN.

The error position decision unit 2533_2 generates the error occurrence position EADR by identifying a row symbol and a column symbol in which an error has occurred by performing a Berlekamp Massey algorithm and a Chien search algorithm on the syndrome SYN.

Figure 5:
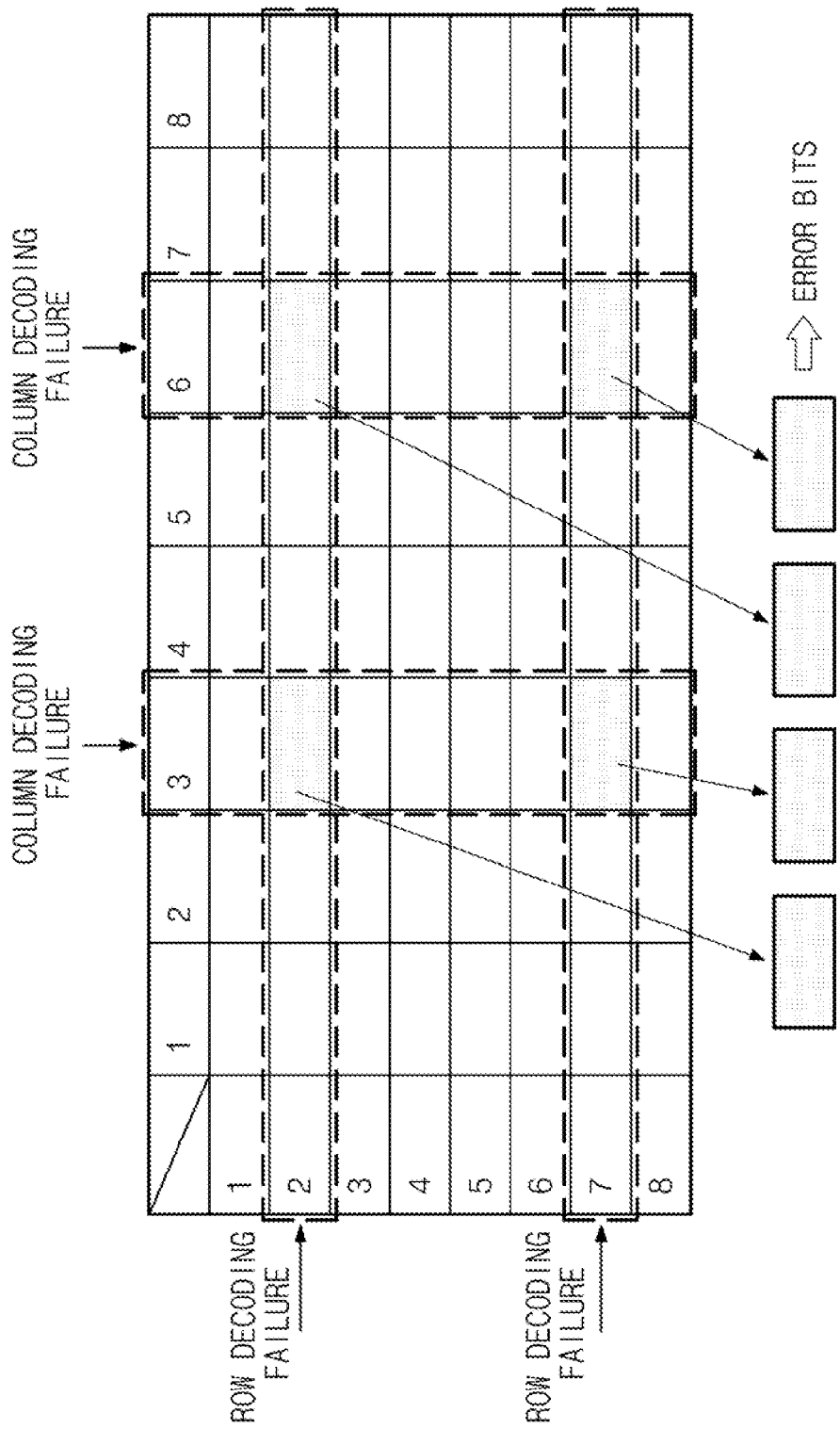
FIG. 5 is a conceptual diagram illustrating a method of identifying an error occurrence position according to an embodiment of the present disclosure.

FIG. 5 is a conceptual diagram of a method of identifying an error occurrence position according to an embodiment of the present disclosure.

FIG. 5 illustrates the identification of error occurrence positions in relation to a plurality of memory cells that is arranged in 8 rows and 8 columns. In FIG. 5, each region indicated by rows and columns may physically correspond to units in a plurality of rows and columns in accordance with encoding and the decoding method. That is, each of error occurrence regions shown in FIG. 5 may include a plurality of memory cells.

The hard decision unit 2533 performs decoding on each row and each column. As a result of the decoding, the decoding has been illustrated as failed in the columns 3 and 6 and the rows 2 and 7.

If a syndrome is generated for only one row and one column, an error of the row 7 cannot be corrected if it is determined that an error has occurred in the column 3. The same is true of a row.

Accordingly, the hard decision unit 2533 according to an embodiment of the present disclosure may determine that errors have occurred in the row 2 ×column 3, the row 2 ×column 6, the row 7 ×column 3, and the row 7 ×column 6 and generate the error occurrence positions by independently generating syndromes for the plurality of rows and columns.

Accordingly, more errors may be corrected and the time taken to perform error correction may be reduced because most of memory cells in which errors have occurred may be checked through one decoding operation.

Figure 6:
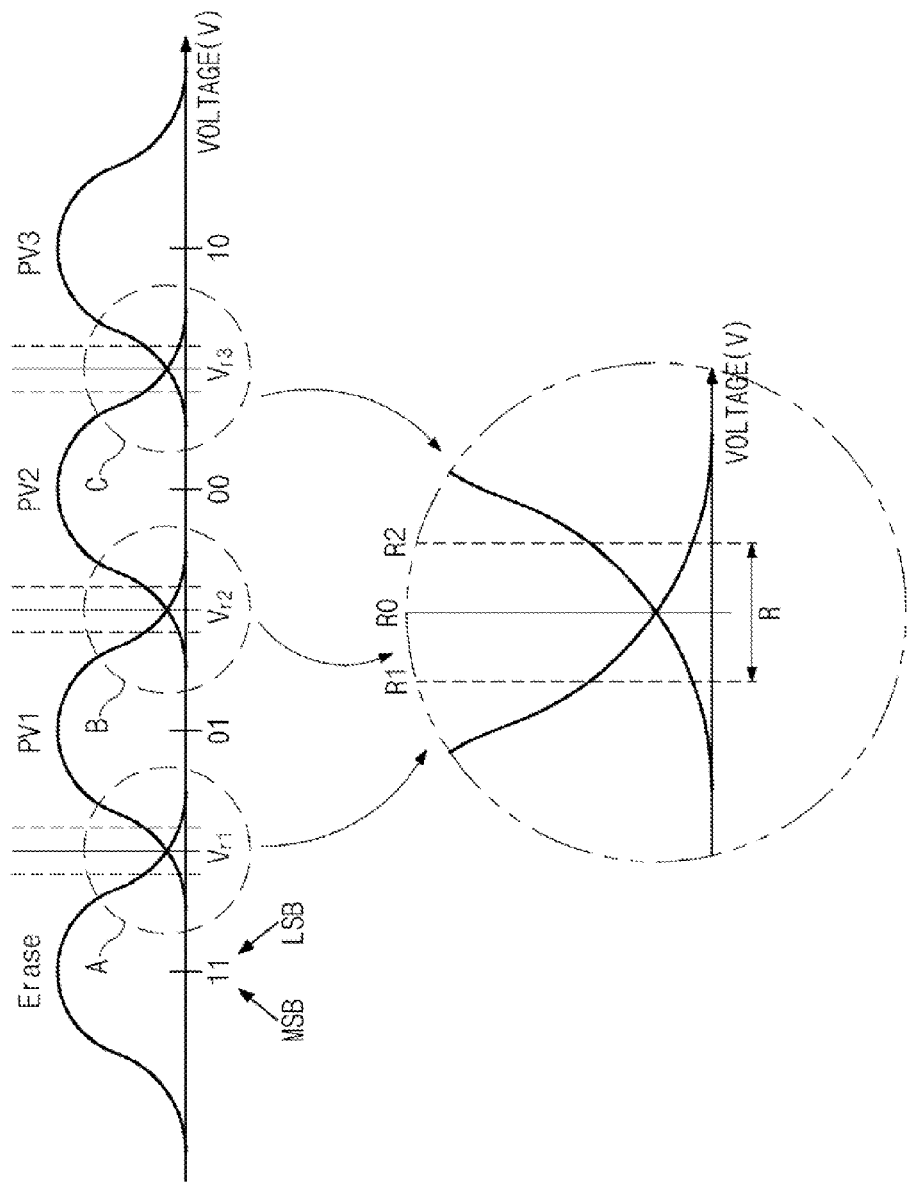
FIG. 6 is a diagram illustrating a method of determining, by a soft decision unit, a low reliability position according to an embodiment of the present disclosure.

FIG. 6 is a diagram illustrating a method of determining, by the soft decision unit, a low reliability position according to an embodiment of the present disclosure.

Referring to FIG. 6, a plurality of memory cells included in the memory cell array 350 may have four states. Data of 2 bits may be stored by setting a most significant bit (MSB) and a least significant bit (LSB) in each of the four states.

The four states may be classified into an erase state Erase, a first state PV1, a second state PV2, and a third state PV3 on the basis of a value of a threshold voltage. The four states have been classified on the basis of whether a transistor included in a memory cell is turned on or off when voltage having a specific value is applied as a read voltage.

For example, when a read voltage Vr1 is applied, all cells placed in the first state PV1, the second state PV2, and the third state PV3 in which respective threshold voltages are higher than the read voltage Vr1 are turned off, and only a cell placed in the erase state Erase is turned on.

However, memory cells placed at boundary parts indicated by dotted lines with the read voltages Vr1, Vr2, and Vr3 as the centers may be determined to have different states from their actual states. For example, a memory cell of the erase state Erase in the boundary part may be determined to have the first state PV1 and a memory cell of the second state PV2 in the boundary part may be determined to have the third state PV3.

Whether a transistor is turned on or off in response to a read voltage may be different depending on a shift of a threshold voltage. For example, if electrons are injected into the floating gate of a memory cell too much or too little, a threshold voltage may become higher or lower than the original threshold voltage. As a result, a state different from an intended state may be determined.

Accordingly, if the boundary of each state is widened, the risk that a memory is differently determined is reduced because the number of memory cells placed in a boundary state is reduced. As a result, in order to secure data reliability, it is important to secure a read margin. It is however not easy to secure a read margin because an operation voltage is lowered as the size of an electronic device is reduced.

In the present disclosure, memory cells placed in a specific voltage radius R with a read voltage as the center are determined to be low reliability cells. Reliability cannot be guaranteed because the memory cells placed in a specific voltage radius R with a read voltage as the center are placed in a range in which a threshold voltage may be determined to have two states.

The boundary surface of each state is enlarged and shown on the lower side of FIG. 6. In an ideal case, the states of cells are classified using a read voltage R0 as a boundary.

For example, when a region A has been enlarged, if the read voltage R0 is applied to memory cells, memory cells placed in the erase state Erase are to be turned on, and memory cells placed in the first state PV1 are to be turned off.

However, some of memory cells that are to be read as being placed in the erase state Erase are turned of because they have threshold voltages higher than the read voltage R0. Furthermore, some of memory cells that are to be read as being placed in the first state PV1 are turned on because they have threshold voltages lower than the read voltage R0.

The soft decision unit 2531 changes the read voltage RD and reads data of memory cells placed in an error occurrence position again using the read voltage R1. If data of the memory cells is read using the read voltage R1, some of memory cells of the first state PV1 that were turned on when reading data of the memory cells using the read voltage R0 are turned off. Furthermore, some of memory cells of the erase state Erase that were turned off when reading data of the memory cells using the read voltage R0 are turned on. Memory cells whose data bits are changed by changing a read voltage as described above are determined to be low reliability cells.

In accordance with another method, data of memory cells placed in an error occurrence position are read again using the read voltage R2. If data of the memory cells placed in the error occurrence position is read using the read voltage R2, some of memory cells of the first state PV1 that were turned off when reading data of the memory cells using the read voltage R0 are turned on. Furthermore, some of memory cells of the erase state Erase that were turned on when reading data of the memory cells using the read voltage R0 are turned off. Likewise, memory cells whose data bits are changed by changing a read voltage as described above are determined to be low reliability cells.

Like in regions B and C, if data of memory cells is read while changing a read voltage, low reliability memory cells placed at the boundaries of the read voltages Vr2 and Vr3 may be determined.

Memory cells having the states placed in the boundary regions indicated by dotted lines are determined to be low reliability cells by changing a read voltage within a predetermined radius and performing reading again. Accordingly, a low reliability position that belongs to an error occurrence position may be determined. In some embodiments, the number of memory cells including an error may be equal to or greater than the number of low reliability cells.

Such a method is performed using a read voltage within a specific range and may be based on a soft decision decoding method. Accordingly, the data decoding apparatus according to an embodiment of the present disclosure corrects an error by making a soft decision decoding on memory cells determined to have an error in accordance with a hard decision decoding method, thereby being capable of improving an error improvement rate.

Figure 7:
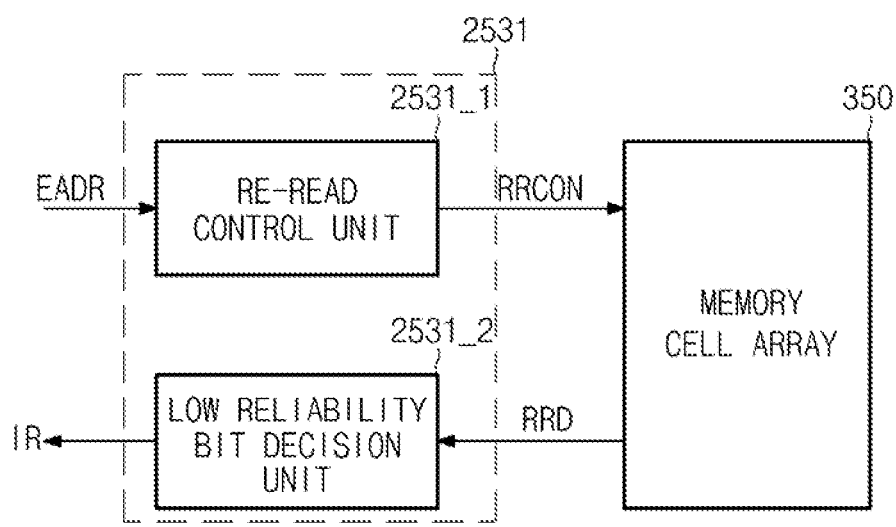
FIG. 7 is a block diagram of a soft decision unit and a memory cell array according to an embodiment of the present disclosure.

FIG. 7 is a block diagram of the soft decision unit 2531 and the memory cell array 350 according to an embodiment of the present disclosure.

Referring to FIG. 7, the soft decision unit 2531 may include a re-read control unit 2531_1 and a low reliability bit decision unit 2531_2.

The re-read control unit 2531_1 may receive the error occurrence position EADR from the hard decision unit 2533, generate a re-read control signal ERCON, and provide the re-read control signal ERCON to the memory cell array 350. The re-read control signal ERCON enables the memory cell array 350 to read data at the error occurrence position EADR using a different read voltage so that re-read data RRD is received from the memory cell array 350.

As described above with reference to FIG. 6, the re-read control signal ERCON controls the memory cell array 350 so that it read data again based on a read voltage that has been changed from a read voltage, first used to the read data RD by the hard decision unit 2533, by a predetermined amount.

For example, if the read data RD has been read based on the read voltage R0, the re-read control unit 2531_1 controls the memory cell array 350 so that it reads data again based on the read voltage R1 or the read voltage R2. In such a case, the predetermined amount may correspond to R/2.

In some embodiments, in the case where a read voltage has been changed from an actual read voltage (e.g., R0 in FIG. 6) that is a basis for the read data RD by a small amount, reliability of data changed by such a read voltage may be determined to be low that much. As a result, reliability of a memory cell may be proportion to the amount of a changed read voltage.

The low reliability bit decision unit 2531_2 determines a bit that has been flipped by comparing the re-read data RRD, received from the memory cell array 350, with the existing read data RD. The flip in the bit may mean that a state has been changed by a change of a read voltage, and the state is placed in the boundary region of FIG. 6.

The low reliability bit decision unit 2531_2 determines a low reliability cell and transfers the low reliability position IR of the low reliability cell to the error correction unit 2535. In some embodiments, the number of memory cells included in the low reliability position IR may be equal to or smaller than the number of memory cells included in the error occurrence position EADR.

In some embodiments, each of memory cells included in the memory cell array 350 may store one or more bits. A low reliability cell may mean that a bit flip has occurred in at least one bit of a corresponding cell. Furthermore, if a memory cell includes a plurality of bits, it may be determined which bit is changed depending on a read voltage. Accordingly, the low reliability position IR may include information regarding that what bit of the low reliability cell has low reliability in addition to the position of the low reliability cell.

The error correction unit 2535 may correct an error of the read data RD from a memory cell at the low reliability position IR and provide the corrected data to the hard decision unit 2533 as corrected read data CRD.

In some embodiments, the error correction unit 2535 may generate corrected read data CRD by flipping at least one bit of the read data RD stored in memory cells that are determined to be low reliability cells. In some embodiments, the error correction unit 2535 may generate corrected read data CRD by flipping a bit determined to be a low reliability bit, of a plurality of bits of memory cells determined to be low reliability cells.

In the data decoding apparatus 10 according to an embodiment of the present disclosure, the hard decision unit 2533 may determine whether or not an error is present in the corrected read data CRD through TPC decoding, and the soft decision unit 2531 may make a soft decision decoding again while changing a read voltage based on whether an error is present or not.

In other embodiments, if a TPC decoding failure is generated in the hard decision unit 2533 the error correction unit 2535 may correct an error based on the TPC decoding failure.

As described above, a determination of whether an error is present in the error correction data CRD generated after re-reading may be selectively made by the hard decision unit 2533 and the soft decision unit 2531. After a determination of whether or not an error is present and an error correction process are repeatedly performed, the entire decoding operation may be terminated.

The repetitive determination of whether or not an error is present and the repetitive error correction process may be performed by a predetermined number of times. The predetermined number of times may be set by the controller 200 or the host 100.

Figure 8:
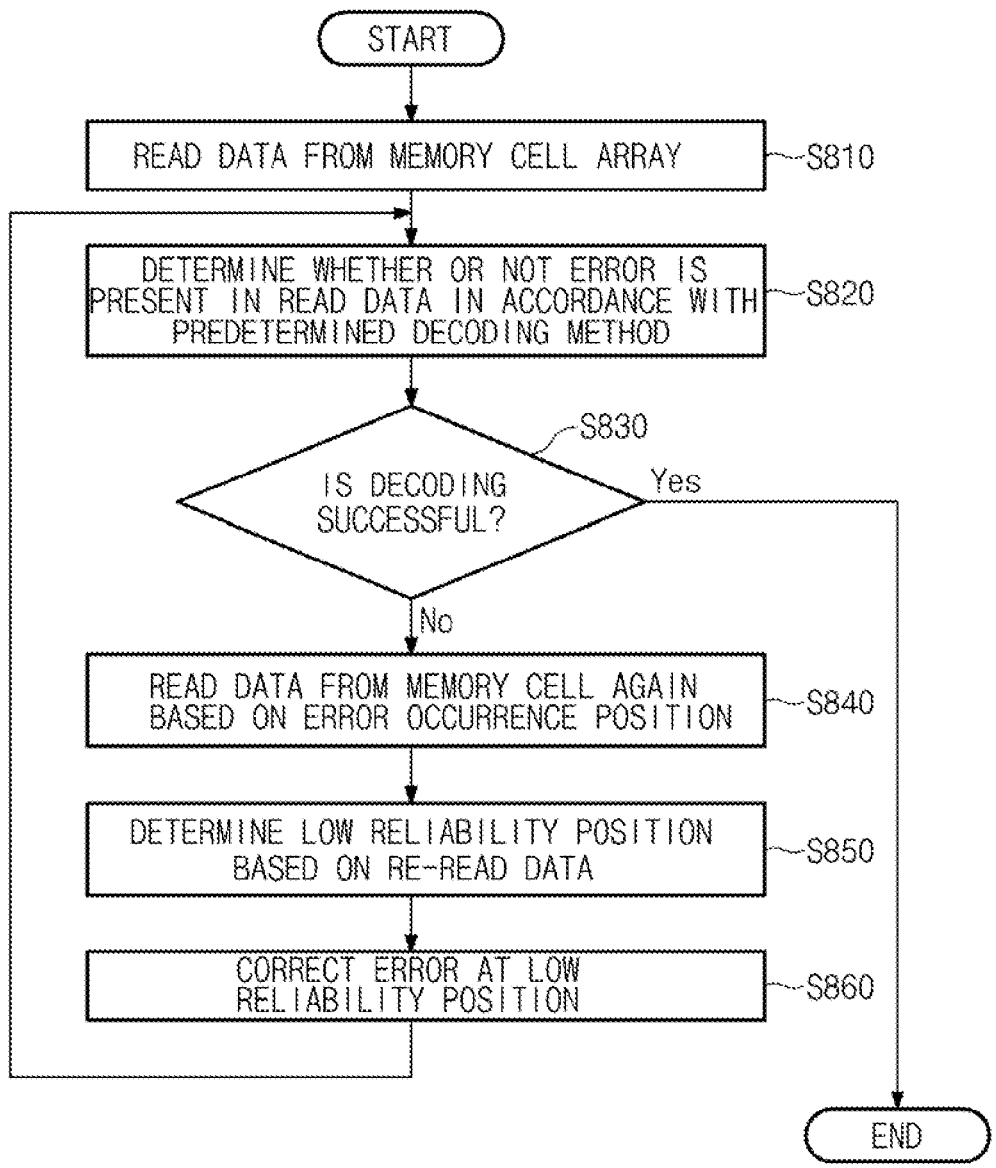
FIG. 8 is a flowchart illustrating a data decoding method according to an embodiment of the present disclosure.

FIG. 8 is a flowchart illustrating a data decoding method according to an embodiment of the present disclosure.

The data decoding method according to an embodiment of the present disclosure is described below with reference to FIGS. 1 to 8.

The error correction device 250 reads data from the memory cell array 350 at step S810. The error correction device 250 may read data at a specific position of the memory cell array 350 based on an address received from the controller 200.

The hard decision unit 2533 determines whether or not an error is present in the received read data RD at step S820. The hard decision unit 2533 may determine whether or not an error is present in the read data RD and identify an error occurrence position in accordance with a predetermined decoding method.

As described above with reference to FIG. 4, the hard decision unit 2533 may generate a syndrome SYN and determine whether or not an error is present in the read data RD in accordance with a TPC decoding method and identify the error occurrence position based on the generated syndrome SYN.

If decoding is successful (Yes, S830), the decoding is terminated because an error has not occurred in a corresponding memory cell.

If the decoding is unsuccessful (No, S830), the soft decision unit 2531 reads data from the corresponding memory cell again based on the error occurrence position EADR at step S840. More particularly, as described above with reference to FIGS. 6 and 7, the soft decision unit 2531 changes a read voltage by a predetermined amount and reads data from the memory cell array 350 again.

The soft decision unit 2531 determines a low reliability position IR that belongs to the error occurrence position depending on whether a bit of the re-read data RDD is flipped or not at step S850.

The error correction unit 2535 generates error correction data CRD by flipping one or more bits at the low reliability position IR that belong to the read data RD at step S860.

The error correction data CRD is provided to the hard decision unit 2533 again, and steps S820 to S860 may be repeated.

In some embodiments, such steps may be repeated by a predetermined number of times. In other embodiments, data has been corrected once through the hard decision unit 2533 and the soft decision unit 2531 may be determined more in accordance with only a hard decision decoding method.

The apparatus and method for decoding data according to an embodiment of the present disclosure may determine whether or not an error is present in each row and each column independently in accordance with a hard decision decoding method and determine a bit having low reliability in accordance with a soft decision decoding method in relation to a position where an error has occurred. Accordingly, a bit error rate may be reduced by correcting an error determined through a hard decision decoding method and a soft decision decoding method.

Furthermore, the apparatus and method for decoding data according to the embodiments of the present disclosure may improve decoding performance using soft decision decoding method that may supplement a hard decision decoding method that uses a TPC method.

The apparatus and method for decoding data according to the embodiments of the present disclosure may significantly reduce a data error rate by correcting a data error using both a hard decision decoding method and a soft decision decoding method.

The apparatus and method for decoding data according to the embodiments of the present disclosure may correct more data errors by correcting an error of data stored in a plurality of cells.

While certain embodiments have been described above, it will be understood to those skilled in the art that the embodiments described are by way of example only. Accordingly, the apparatus and method described herein should not be limited based on the described embodiments. Rather, the apparatus described herein should only be limited in light of the claims that follow.

What is claimed is:

1. A data decoding apparatus, comprising:
a first decision unit configured to determine whether or not an error is present in a read data based on a first decoding method and identify an error occurrence position by independently generating syndromes for a plurality of rows and columns of a plurality of memory cells, wherein the read data is read by a first read voltage;
a second decision unit configured to determine a low reliability position that belongs to the error occurrence position by checking reliability of the error occurrence position based on a second read voltage changed from the first read voltage within a set range; and
an error correction unit configured to generate an error correction data by correcting an error of the low reliability position.

2. The data decoding apparatus of claim 1, wherein the first decision unit determines whether an error is present in the error correction data received from the error correction unit based on the first decoding method.

3. The data decoding apparatus of claim 1, wherein the second decision unit re-reads data of memory cells in the error row and error column included in the error occurrence position while changing the second read voltage within the set range and determines the low reliability position by comparing a re-read data with the read data.

4. The data decoding apparatus of claim 1, wherein the error correction unit inverts bits included in the read data at the low reliability position and provides the error correction data to the first decision unit.

5. The data decoding apparatus of claim 1, wherein the read data comprises write bits and parity bits.

6. The data decoding apparatus of claim 5, further comprising:
a host configured to provide the write bits to be written into a set position of the memory cells.

7. The data decoding apparatus of claim 5, further comprising:
an encoder configured to generate the parity bits to be written into the memory cells based on the write bits.

8. The data decoding apparatus of claim 1, wherein the plurality of cells comprises non-volatile memory cells.

9. A data decoding method, comprising:
determining whether or not an error is present in a data and identifying an error occurrence position based on a first decoding method, wherein the data is read by a first read voltage;
determining a low reliability position that belongs to the error occurrence position by reading data at the error occurrence position using a second read voltage changed from the first read voltage; and
generating an error correction data by correcting an error of the low reliability position,
wherein the determining and identifying comprises:
independently generating syndromes for a plurality of rows and a plurality of columns, wherein a plurality of memory cells are disposed in regions where the plurality of rows intersects the plurality of columns; and
identifying a row symbol and a column symbol of the error occurrence position based on the syndrome.

10. The data decoding method of claim 9, further comprising:

repeating at least one of the determining and identifying and the determining of the low reliability position on the error correction data.

11. The data decoding method of claim 10, wherein the identifying of the row symbol and the column symbol of the error occurrence position based on the syndrome is performed using Berlekamp Massey algorithm and a Chien search algorithm.

12. The data decoding method of claim 10, wherein the determining of the low reliability position comprises:

reading the data at the error occurrence position from a corresponding memory cell of the plurality of memory cells while changing the second read voltage; and determining a position of the read data to be the low reliability position if a data flip is generated in the read data.

13. The data decoding method of claim 9, wherein the generating of the error correction data comprises:

inverting bits of the read data at the low reliability position.

14. The data decoding method of claim 9, wherein the data comprises write bits and parity bits.

15. The data decoding method of claim 14, wherein the determining and identifying determines that the error is present if written parity bits are different from read parity bits.

16. A data decoding apparatus, comprising:

a plurality of memory cells arranged in rows and columns;

a first decision unit configured to check first read data of the memory cells in each of the rows and columns and determining error memory cells having an error by independently generating syndromes for the each of the rows and columns;

a second decision unit configured to re-check second read data of the error memory cells and determining a low reliability memory cell of the error memory cells, wherein the second read data is read by a different voltage from a voltage by which the first read data is read; and an error correction unit configured to generate an error correction data by correcting a data of the low reliability memory cell.

17. The data decoding apparatus of claim 16, wherein the low reliability memory cell is determined where the second read data is different from the first read data.

18. The data decoding apparatus of claim 16, wherein at least one of the first decision unit and the second decision unit repeatedly check the low reliability memory cell.

\* \* \* \* \*